United States Patent [19]

Asano

[11] 4,301,461
[45] Nov. 17, 1981

[54] LIGHT EMITTING DIODE

[75] Inventor: Toshiaki Asano, Yokohama, Japan

[73] Assignee: Canon Kabushiki Kaisha, Tokyo, Japan

[21] Appl. No.: 104,846

[22] Filed: Dec. 18, 1979

[51] Int. Cl.³ .............................................. H01L 33/00
[52] U.S. Cl. ........................................ 357/17; 357/18; 357/72; 250/552
[58] Field of Search ..................... 357/17, 18, 30, 72; 250/552

[56] References Cited

U.S. PATENT DOCUMENTS

| | | | |
|---|---|---|---|
| 3,764,862 | 10/1973 | Jankowski | 317/234 R |
| 3,805,347 | 4/1974 | Collins | 29/25.13 |
| 3,834,883 | 9/1974 | Klein | 65/32 |
| 3,954,534 | 5/1976 | Scifrea | 156/7 |
| 4,003,074 | 1/1977 | Yonezu | 357/74 |
| 4,009,394 | 2/1977 | Mierzwinski | 250/552 |
| 4,017,881 | 4/1977 | Ono | 357/18 |

*Primary Examiner*—Martin H. Edlow
*Attorney, Agent, or Firm*—Fitzpatrick, Cella, Harper & Scinto

[57] ABSTRACT

A light emitting diode (LED) having excellent directivity, which is provided with a light emitting surface formed by a PN-junction of a semiconductor body, and a dome of a transparent material formed on the light emitting surface. The external surface of the dome is made a light emitting window. This external surface is in a semi-spherical shape at least in its one part, and the light emitting surface is on the symmetrical axis of the semi-spherical surface. Further, the light emitting surface is disposed at a position displaced for a finite distance in the direction opposite to the light emitting direction with respect to the center of curvature of the semi-spherical surface. With such construction of the LED, light from the light emitting surface intensifies its directivity at the time of its emission from the external surface of the dome.

3 Claims, 17 Drawing Figures

LIGHT EMITTING DIODE

1. Field of the Invention

This invention relates to a dome type light emitting diode (hereinafter abbreviated as "LED").

2. Description of Prior Arts

There have heretofore been known various LED's made of compound semiconductors, as the raw material, such as GaAs, GaP, GaAlP and so forth. In the LED's which utilize a flat PN-junction surface as the light emitting surface, however, the light tends to be projected with a wide angle, hence its directivity is weak. With a view to intensifying its directivity, therefore, there has recently been developed a dome type LED with its light orientation characteristic having been improved in comparison with the conventional flat surface type LED.

Illustrating a typical example of such dome type LED in FIG. 1 of the accompanying drawing, the LED has its light emitting surface formed with a PN-junction 1 of an N-type GaAs 2 and a P-type GaAs 3. An external surface 5 of a transparent, thick layer of GaAs 4 is shaped to constitute a portion of a spherical surface with an axis Z as its symmetrical axis, thereby forming a part of a light emitting window for light from the light emitting surface. A numeral 10 refers to electrodes.

Up to the present, there have been proposed various shapes of the dome for the dome type LED. The dome type LED is intended to improve the light orientation characteristics of the projected light due to the light collecting function of the external surface of the dome. In order to obtain an LED having a strong directivity, there has been proposed as an example, the shaping of the external surface of the dome in a semi-spherical shape for ease in fabrication. In this example, the external surface of the dome is shaped in such a manner that the light emitting surface may be at the center of curvature of the semi-spherical surface, or at a position displaced to the side of the light emitting direction from the center of curvature.

The LED has recently found use in a wide variety of fields. In one example, it is used as a spot illuminating device as shown in FIG. 2 by incorporating the same in an image focusing optical system. In this instance, however, loss in the light quantity emitted from the LED 6 is considerable due to shading by the image forming lens system 7 having a limited aperture. This is an unacceptable condition where a bright spot is required.

The abovementioned disadvantages may be improved to a certain extent when the aperture ratio of the image forming lens system 7 is made large. However, an increase in the aperture ratio of the lens system to a remarkable extent is difficult from both physical and economical points of view, so that other measures for solution have been sought. One effective method is to fabricate an LED having a very strong directivity in a predetermined direction (for example, in the direction of the axis Z in FIG. 1) to thereby reduce the light quantity shaded by the image forming lens system. As one example, the LED is mounted on an enclosing device which utilizes a glass lens. This type of LED is large in size for the illuminating system, and is not so favorable as a small type illuminating system.

Japanese Patent Publication No. 50-19440 discloses means for intensifying the directivity of light in the dome type LED, in which the light emitting surface is formed along the surface of a conical base plate.

SUMMARY OF THE INVENTION

It is an object of the present invention to provide an LED having strong directivity and high luminance.

It is another object of the present invention to provide a dome type LED having strong directivity and which is easy to shape its outer surface.

It is still another object of the present invention to provide an LED capable of performing bright spot illumination on an image projecting surface through an ordinary projecting lens.

The present invention has been successfully achieved by the realization that, in an LED having a semi-spherical dome window as shown in FIG. 1, there exists a range in which the directivity and luminance of the projecting light increases when the light emitting surface is displaced from the center of curvature of the semi-spherical surface in the direction opposite the light emitting direction ($-Z$ axis direction). From this discovery, the conditions for producing an LED having desired light orientation characteristics are found through experimentation, whereby an LED of a type adapted to the conditions as found, can be manufactured.

DESCRIPTION OF THE PREFERRED EMBODIMENTS

Figure 3:
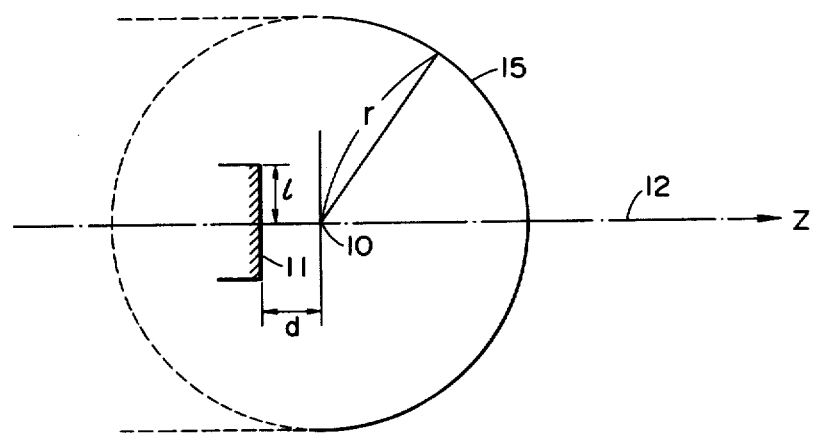
FIG. 3 is a cross-sectional view showing a position of a light emitting surface in an LED.

Referring now to FIG. 3 which shows a positional relationship between a dome window and a light emitting surface, the dome window has a semi-spherical surface 15 of a radius r with a point 10 as its center and a base line 12 as its symmetrical axis. The light emitting surface 11 formed of a PN-junction of a semiconductive body is a circle having a radius l and set at a position on an axis Z displaced by a distance d with respect to the center of curvature 10. According to the researches and studies done by the present inventor, it has been found that the light orientation characteristic of the LED according to the present invention tends to indicate strong directivity in the direction of the axis Z by displacing the light emitting surface from the center of the semi-spherical surface in the direction of the $-Z$ axis (i.e., a negative distance of d), and the intensity of its directivity, i.e., sharpness in the light orientation distribution, remarkably varies in accordance with the relative ratio between the radius r of the spherical surface of the abovementioned dome window and the quantity of displacement d of the light emitting diode from the center of the spherical surface. It should however be noted that the refractive index of the dome is fixed at a value as high as n=3.5 or so, because the material forming the dome 3 is limited to a particular material such as semiconductors, etc.

Figure 1:
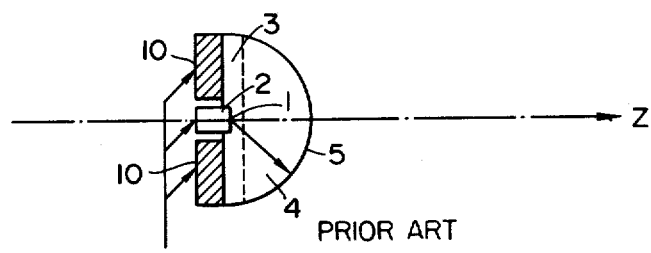
FIG. 1 is a cross-sectional view of a conventional dome-type LED.
Figure 2:
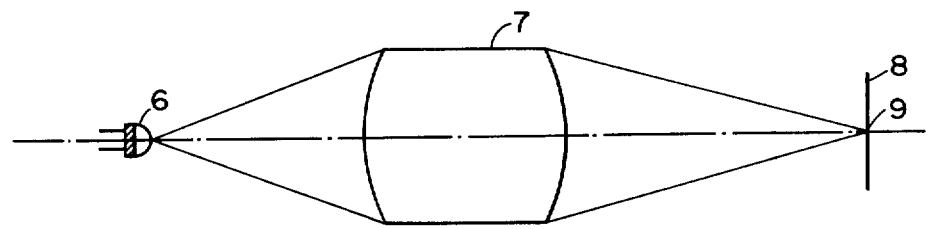
FIG. 2 shows a spot illumination optical system utilizing an LED.
Figure 4:
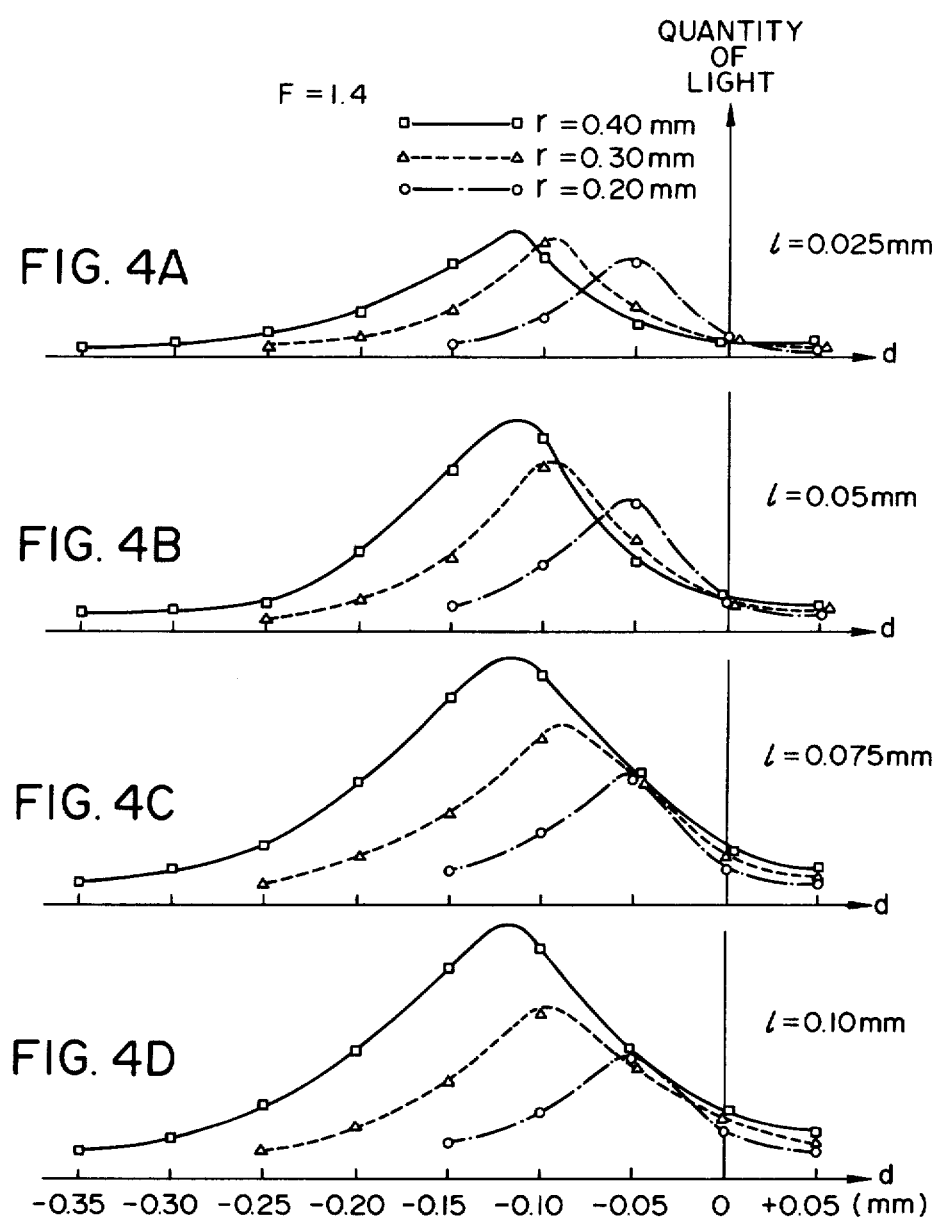
FIGS. 4A-D and 5A-D are graphical representations, in which light quantity transmitting through the image-forming lens is plotted relative to variations in each parameter.
Figure 5:
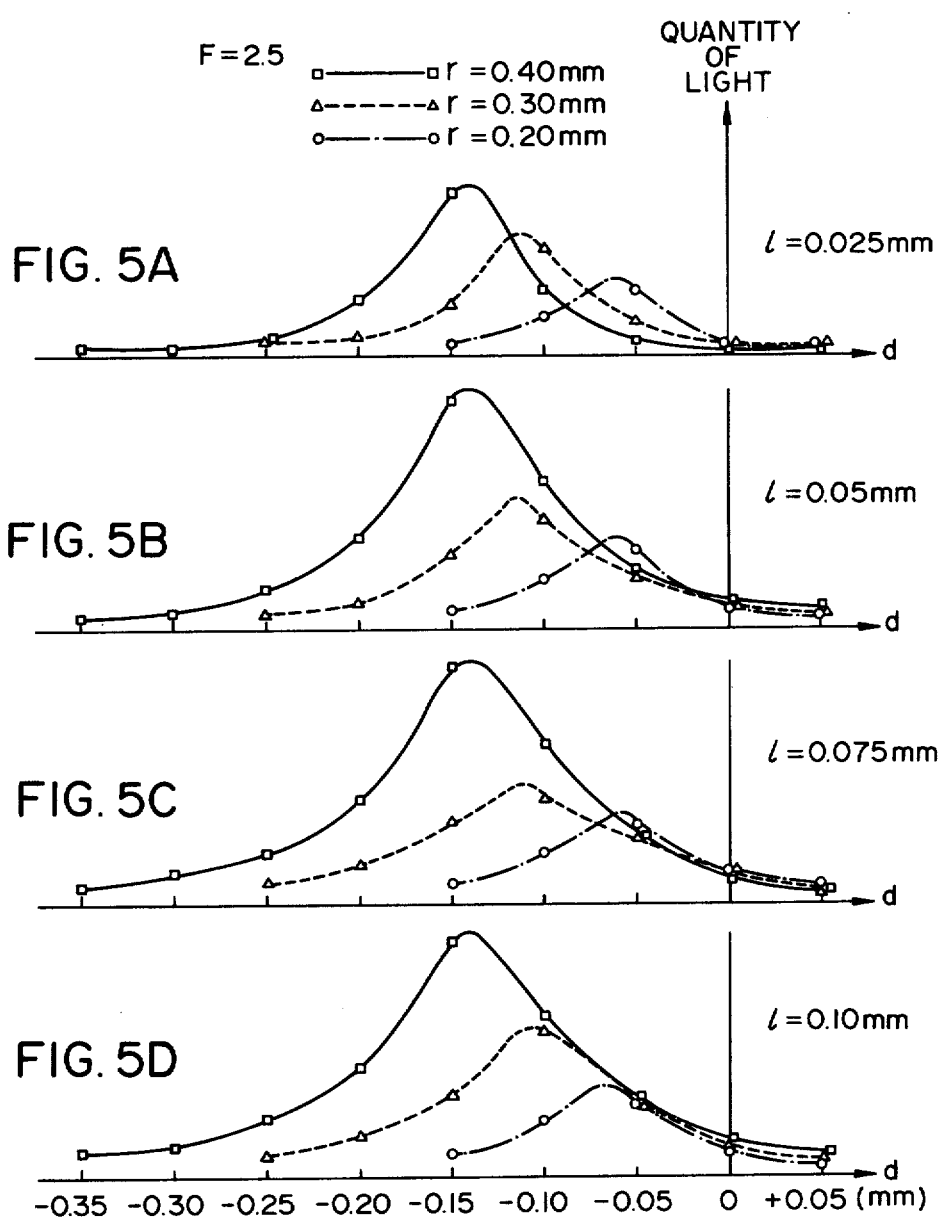

In the following, preferred examples according to the present invention will be described, in which each of the parameters is varied. Incidentally, the position of the LED in FIG. 2 is required to be changed by changing the relative distance between the LED and the image forming lens system in accordance with a distance between the illuminating spot projection position 9 and the image forming lens system 7. However, when the LED having a strong directivity is used, the quantity of the light transmitting through the image forming lens is not substantially effected, even if the LED slightly changes its position in correspondence to change in the image projecting position. On account of this, in the data of the following preferred embodiments, the position of the LED is fixed at the focal position of the image forming lens. Example 1 (FIG. 4 embodiment):

The LED is positioned on the focal plane of an image forming lens system having an F-number of 1.4. A sum of light quantity projected from the above-mentioned lens is taken on the axis of the ordinate. The abscissa, on the other hand, denotes the Z co-ordinate d of the light emitting surface. It is to be noted that FIG. 4(a) shows a case wherein a radius of the light emitting surface $l=0.025$ mm; FIG. 4(b) $l=0.05$ mm; FIG. 4(c) $l=0.075$ mm; and FIG. 4(d) $l=0.10$ mm. Also, in the graphical representations in FIG. 4(a) to 4(d), solid lines indicate the radius of the semi-spherical surface $r=0.40$ mm; dash lines indicate $r=0.30$ mm; and dot-and-dash lines show $r=0.20$ mm. As is apparent from FIG. 4, the light quantity passing through the image forming lens, not depending on the values of r and l, increases in the region where the value of d is negative. The positive region of d has a small quantity of transmitting light in comparison with the case of $d=0$. Further, a range where the light quantity S transmitting through the image forming lens increases in comparison with the case of $d=0$, even when d is negative, remarkably varies with variations in the radius of the semi-spherical surface r, but does not materially depend on the value of the radius of the light emitting surface l. Example 2 (FIG. 5 embodiment):

A lens having an F-number of 2.5 was used as the image forming lens system.

The co-ordinate axes in the graphical representations are the same as in FIG. 4, above. The dependability trend of the transmitting light quantity through the lens system with respect to r, d, and l does not substantially change, even when the F-number becomes large (i.e., even when the aperture ratio becomes small).

Figure 6:
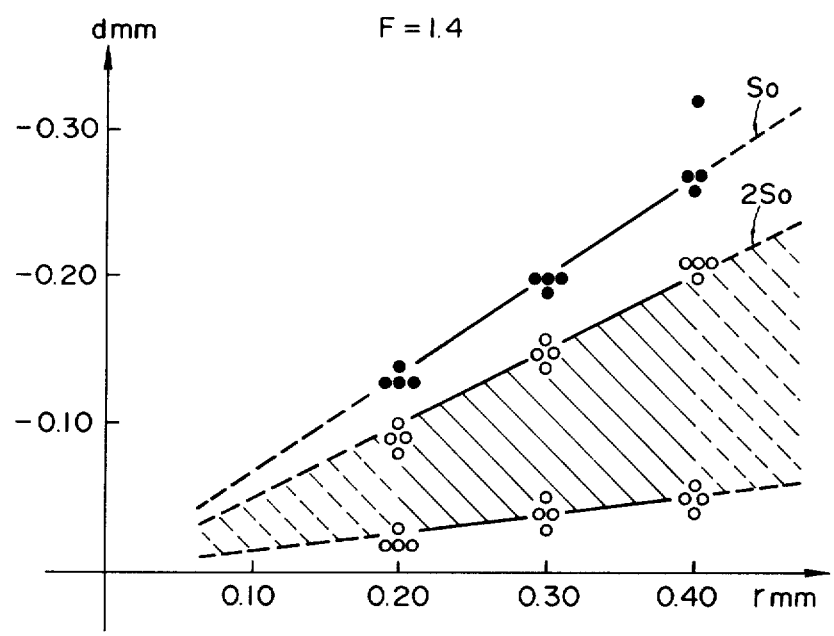
FIGS. 6 and 7 are also graphical representations illustrating an improved region for the LED in terms of each parameter in comparison with the conventional LED's.
Figure 7:
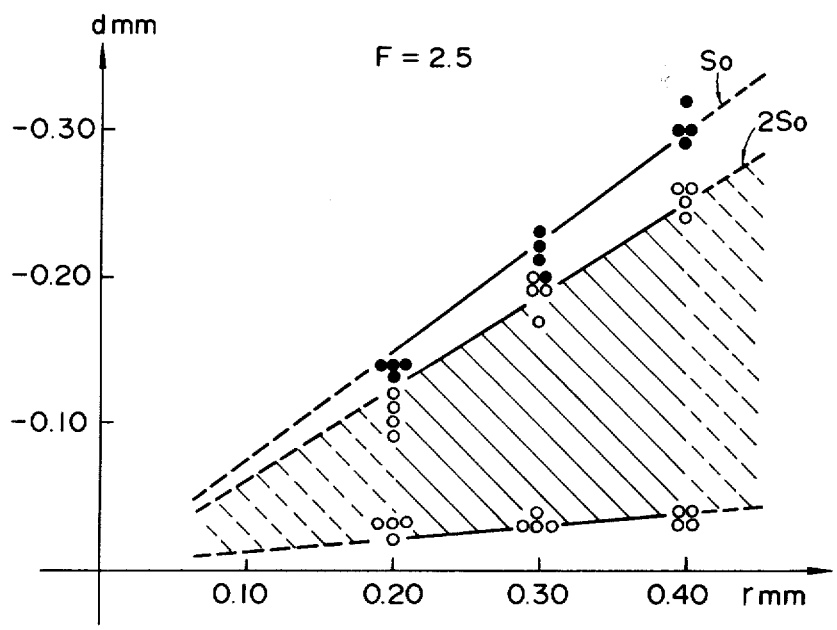

FIGS. 6 and 7 show the ranges of the parameters r and d, wherein the light emission directivity of the LED has become substantially intensified in comparison with that in the conventional LED. Black dots indicate the lower limit values of d, at which the transmitting light quantity S through the image forming lens system becomes higher than $S_O$ ($S_O$ is a transmitting light quantity when the light emitting surface is on $d=0$ (a displaced position on the co-ordinate axis). On the other hand, white dots show the upper and lower limits of d in relation to r, wherein the transmitting light quantity S becomes higher than $2S_O$. Accordingly, the region indicated by diagonal lines is always able to cause the light quantity of more than two times as large as that of the LED of the conventional construction to pass. As will be understandable from the drawing, these upper and lower limits may be approximately expressed in terms of the primary function of r. The region of $S>S_O$ is denoted by $0<|d|<0.65$ r in case the F-number of the image forming lens is 1.4, and $0<|d|<0.70$ r in case the F-number is 2.5. In other words, the range becomes widened as the aperture ratio of the image forming lens becomes smaller. Also, the region of $S>2S_O$ is denoted by $0.13$ $r<|d|<0.50$ r in case the F-number of the image forming lens is 1.4, and $0.10$ $r<|d|<0.61$ r in case the F-number is 2.5. In the same manner as mentioned above, the range becomes widened as the aperture ratio of the projecting lens becomes smaller.

Accordingly, when the spot illumination, etc. is effected by disposing the LED in the vicinity of the focal plane of an ordinary image forming lens system, it is possible to obtain an LED having a strong directivity, hence bright spot illumination, by displacing the light emitting surface in the direction of the $-Z$ axis. When the condition of $0.13$ $r<|d|<0.50$ r is satisfied, the spot illumination having brightness twice as great as that in the conventional spot illumination becomes possible with use of the image forming lens which is generally used.

Figure 8:
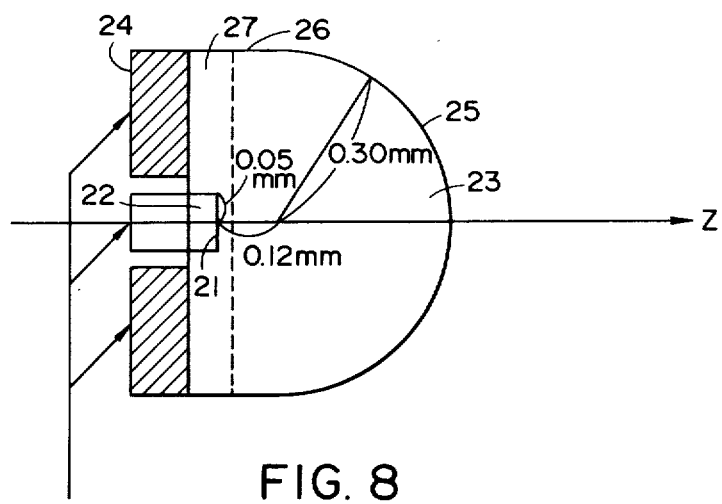
FIGS. 8 and 9A-B are respectively cross-sectional views of preferred embodiments of the LED according to the present invention.
Figures 9A, 9B:
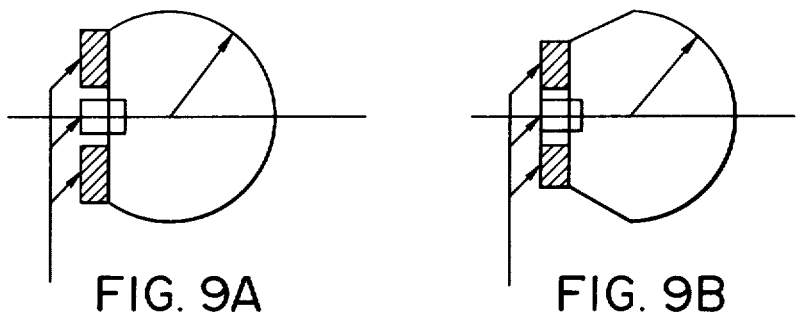

In the following, explanations will be given as to a concrete configuration of the LED according to the present invention. FIG. 8 shows the most preferred configuration of the LED from the standpoint of the working technique, in which the dome 23 is formed of a semi-spherical surface 25 having a radius of 0.30 mm in its outer surface, and a cylindrical side surface 26. A reference numeral 24 denotes an electrode. The radius of the light emitting surface is set at $l=0.05$ mm, and the light emitting surface is shaped in such a manner that it is displaced from the center of the semi-spherical surface 25 by 0.12 mm in the direction of the $-Z$ axis using a value of $d=0.12$ mm selected from FIG. 4 in each case, at which the light quantity transmitting through the image forming lens system becomes the maximum. Accordingly, in comparison with a case wherein the light emitting surface is disposed at the center of the semi-spherical surface, a light quantity of four times as large as the ordinary light quantity passes through the image forming lens system having the F-number of 1.4, as can be determined from the graphical representation in FIG. 4(b), whereby a brighter spot illumination for that increased light quantity becomes possible. While it may be relatively easy to form the dome window in such configuration from the standpoint of the working technique, the dome window may also be in the shapes as illustrated in FIGS. 9(a) and 9(b). Such configurations of the dome window have been derived due to the fact that light projecting from the portion in the dome window other than the semi-spherical surface portion can hardly become the light which transmits through the image forming lens. Further, explaining the manufacturing steps in reference to FIG. 8, an n-type epitaxial GaAs layer 22 is first grown on a substrate (not shown), then a P-type GaAs layer 27 is formed along the surface of the N-type layer 22 by means of the diffusion method, etc., and further a thick coating of GaAs layer 23 is grown over the P-type layer 27 by the epitaxial method. Thereafter, the outer surface of this thick coating containing the GaAs layer is abraded and polished so as to finish it in the configuration as mentioned above. The surface is further subjected to the reflection-preventive coating treatment, etc. to increase its light transmission. Incidentally, since the abovementioned thick coating of GaAs layer is formed by the epitaxial method, the dome to be obtained is less in its light absorption. The same can be said of the embodiments shown in FIGS. 9(a) and 9(b).

In the above-described manner, when the present invention is adopted, there can be obtained a desirable light emitting diode (LED) which is very large in its light quantity to be emitted within a predetermined cubic angle with a predetermined axis as the center, i.e., which has a sharp light orientation distribution in a predetermined direction, and yet is easy to manufacture, not being very different from manufacture of the conventional LED. Furthermore, since the LED itself has such characteristics, it can be mounted on a very small illuminating system, unlike fitting it on a surrounding device such as glass lenses, etc., hence it has a wide range of applications. As an example, it may be utilized as a light source for forming projecting light beam for range finding in an automatic focus adjusting mechanism for a photographic camera as taught in U.S. Pat. No. 3,442,193.

Figure 10:
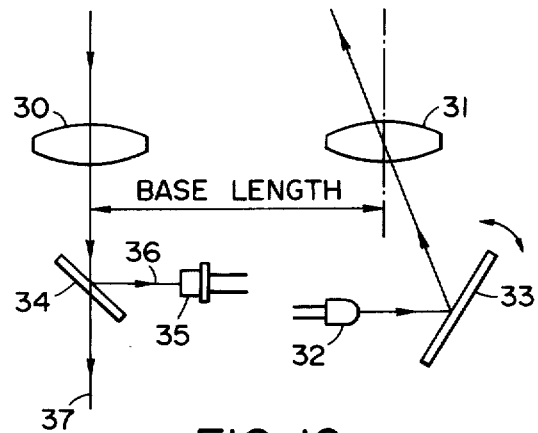
FIG. 10 is a schematic diagram showing one embodiment of an automatic focus adjusting mechanism in a photographic camera, in which the LED of the present invention is incorporated.

In the following, explanations will be given as to an embodiment, wherein the light emitting diode of the present invention has been incorporated in the automatic focus adjusting mechanism of a photographic camera in reference to FIG. 10, which shows the range finding portion of the automatic focus adjusting mechanism being incorporated in a view finder system. In this mechanism, the LED having a strong directivity obtained by the afore-described examples is incorporated as the light source 32 for light spot projection. The light emitted from the LED is reflected by a movable mirror 33, after which it forms a spot pattern by a light projecting lens 31 at a position of excessive focussing. The movable mirror 33 rotates in proportion to a forwarding quantity of the photographic lens (not shown). It also causes the photographic lens to forward from its in-focus position at the infinite distance to its in-focus position at the very near distance, and, at the same time, causes a rotating mirror 33 to rotate. When the above-mentioned spot pattern passes through the object to be photographed, the reflected light from the spot pattern, on which the light has been converged through a light receiving lens 30, is detected by a light receiving element 35 and its peak value is stored. It should, however, be noted here that the LED 32 used in this embodiment is of an infra-red light emission type, and the light passed through the light receiving lens is separated by a cold mirror 34 into visible light and infra-red light, after which the infra-red light 36 is led into the light receiving element 35, while the visible light 37 is led into an observation system.

When the photographic lens is retracted from its in-focus position at the very near distance to its in-focus position at the infinite distance, the retraction of the photographic lens is stopped at a position where the value of the signal to be detected by the light receiving element 35 coincides with the peak value which was initially memorized. At this time, the photographic lens forms an image of the photographic object on the film surface without de-focusing. Accordingly, the image of the photographic object can be taken on the film in this condition without de-focusing. In such automatic focus adjusting mechanism, a bright spot patter is necessary for improving precision in the focus adjustment as well as expansion of the applicable distance range. By the use of the LED according to the present invention, such demand can be satisfied and very remarkable effects can be obtained.

Thus, by the use of the LED according to the present invention, various desirable effects can be derived. Particularly, when the optimum conditions in the present invention are utilized, there can be obtained a projecting light quantity which is several tens of times as high as that of the conventional projecting light quantity, hence high utility accrues for the abovementioned various applications.

What is claimed is:

1. System for projecting light from a light emitting diode comprising:
   (a) projection optical means having means defining an aperture for restricting the range of the direction of the light from the light emitting diode,
   (b) a light emitting diode having a dome provided on a light emitting portion, at least one part of the outer surface of said dome being of semi-spherical shape having a rotatory symmetrical axis, and said light emitting portion being disposed at a position displaced by a finite distance $|d|(|d|>0)$ in a direction opposite to said projection optical means from the center of curvature of said semi-spherical outer surface.

2. System according to claim 1, wherein the F-number of said projection optical means is larger than 2.5, and the radius r of said semi-spherical shape and the finite distance $|d|$ satisfies the following conditions.

$$0.10\,r < |d| < 0.61\,r$$

3. System according to claim 1, wherein the F-number of said projection optical means is larger than 1.4, and the radius r of said semi-spherical shape and the finite distance $|d|$ satisfied the following conditions.

$$0.13\,r < |d| < 0.50\,r$$

* * * * *